United States Patent [19]

Froloff

[11] Patent Number: 4,999,023

[45] Date of Patent: Mar. 12, 1991

[54] HIGH DENSITY LOW REACTANCE SOCKET

[75] Inventor: Philip P. Froloff, Escondido, Calif.

[73] Assignee: Unisys Corporation, Blue Bell, Pa.

[21] Appl. No.: 436,397

[22] Filed: Nov. 14, 1989

[51] Int. Cl.[5] .............................................. H01R 9/09
[52] U.S. Cl. ..................................... 439/68; 439/75;
439/509; 439/841
[58] Field of Search ...................... 439/68, 72, 74, 75,
439/78–83, 86, 91, 96, 46, 788, 840, 841

[56] References Cited

U.S. PATENT DOCUMENTS

| | | | |
|---|---|---|---|
| 2,153,177 | 4/1939 | Ecker | 439/841 |
| 3,182,277 | 5/1965 | Ashby | 439/509 |
| 4,591,222 | 5/1986 | Shaffer | 439/841 |
| 4,620,761 | 11/1986 | Smith et al. | 439/66 |
| 4,707,657 | 11/1987 | Boegh-Petersen | 439/66 |

Primary Examiner—Paula A. Bradley
Attorney, Agent, or Firm—Charles J. Fassbender; Mark T. Starr

[57] ABSTRACT

A socket for an electronic component is comprised of an electrically insulative base having patterned electrical conductors integrated therein; a plurality of electrically conductive springs are held by the base; the springs are arranged in a pattern such that they can be compressed perpendicular to a plane by respective input/output terminals on the component; and, each spring is a sponge-like mass which is forced against a respective one of the conductors in a direction parallel to the plane in response to being compressed perpendicular to the plane by the component's terminals.

11 Claims, 3 Drawing Sheets

HIGH DENSITY LOW REACTANCE SOCKET

BACKGROUND OF THE INVENTION

This invention relates to electromechanical sockets which connect electronic components such as integrated circuit packages to an electrical system.

An electromechanical socket is characterized as having a plurality of contacts which make and break connections in a non-permanent fashion to respective input/output terminals of an electronic component. In the prior art, it is common for each of the contacts to be U-shaped, and a respective input/output pin on the electronic component fits between the legs of the "U". To open or close the legs of all of the contacts, a single moveable member in the socket is slid back and forth with a lever or cam to deflect the contact legs. One such socket is described, for example, in U.S. Pat. No. 4,506,941 which issued Mar. 26, 1985.

A technical problem, however, with prior art sockets is the maximum density with which the contacts can be spaced. In the prior art, this density is limited not by just the width of the input/output pins themselves, but by: (a) the additional space which the U-shaped legs occupy around the pins, (b) the additional space which must be provided for the legs to open and close, and (c) the additional space which must be provided for the moveable member to fit between all of the legs so that it can push against them.

Another technical problem with prior art sockets is the magnitude of their parasitic reactances. These reactances occur because the legs of the U-shaped contacts are long and thin so that they can be deflected; and, a long, thin contact has an inherent inductance. Also, the inductance of one contact couples to the inductance of other nearby contacts, and, this spreads noise from pin to pin whenever an input/output signal switches.

Still another technical problem with prior art sockets is that their moving parts tend to quickly wear. This occurs due to various frictional forces that are generated when the contacts are opened and closed. In the above cited patent, the moveable member is pushed with a force that must be large enough to overcome the total opposition of all of the U-shaped legs in the socket; and, this produces a proportionately large amount of friction.

Accordingly, a primary object of the present invention is to provide an improved socket in which the above prior art technical problems are overcome.

BRIEF SUMMARY OF THE INVENTION

In one preferred embodiment of the present invention, a socket for an electronic component is comprised of an electrically insulative base having patterned electrical conductors integrated therein; a plurality of electrically conductive springs are held by the base; the springs are arranged in a pattern such that they can be compressed perpendicular to a plane by respective input/output terminals on the component; and, each spring is a sponge-like mass which is forced against a respective one of the conductors in a direction parallel to the plane in response to being compressed perpendicular to the plane by the component's terminals.

BRIEF DESCRIPTION OF THE DRAWINGS

Various features and advantages of the invention are described in detail herein in conjunction with the accompanying drawings wherein.

DETAILED DESCRIPTION OF THE INVENTION

Figure 1:
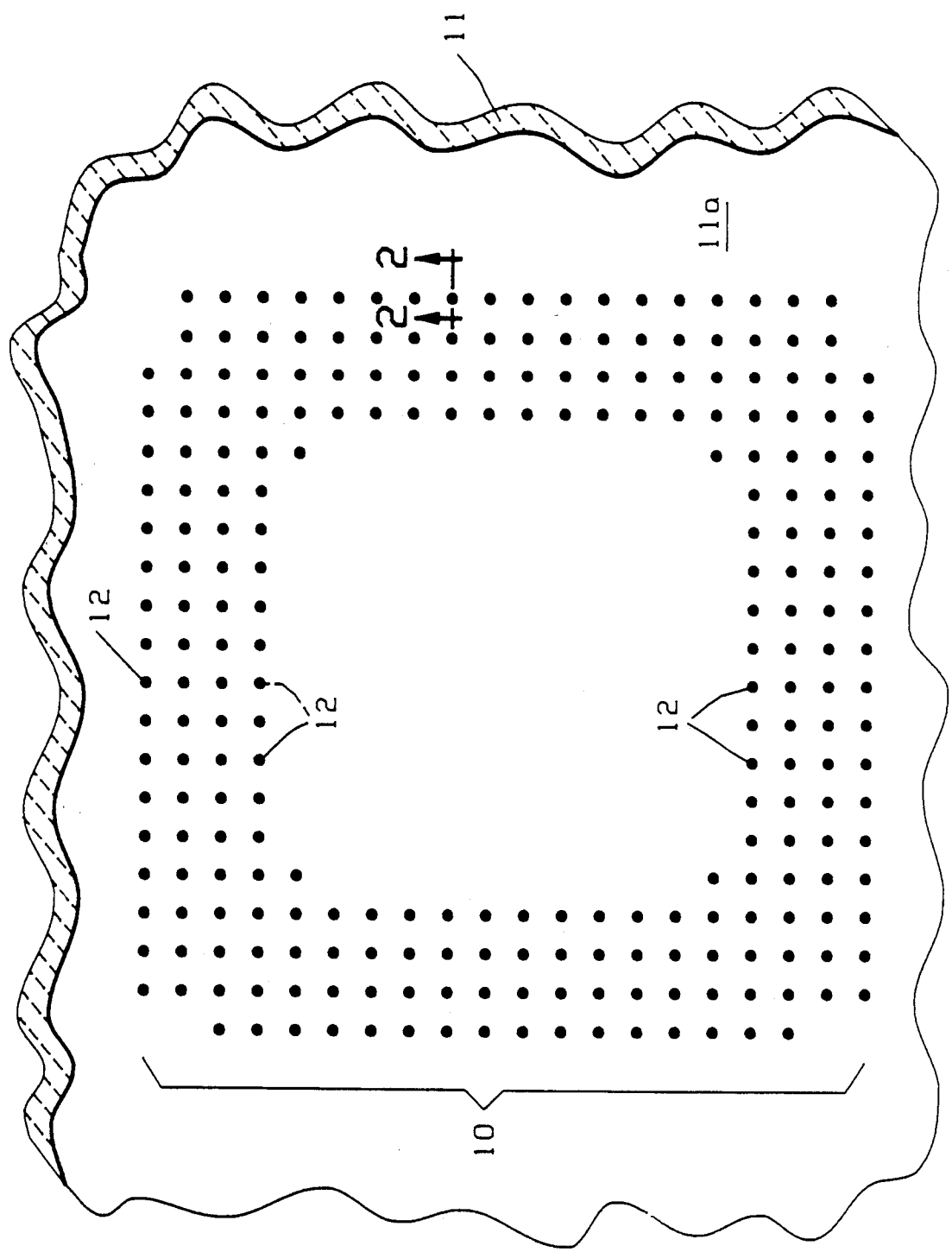
FIG. 1 is an enlarged pictorial view of a preferred embodiment of the invention.
Figure 2A:
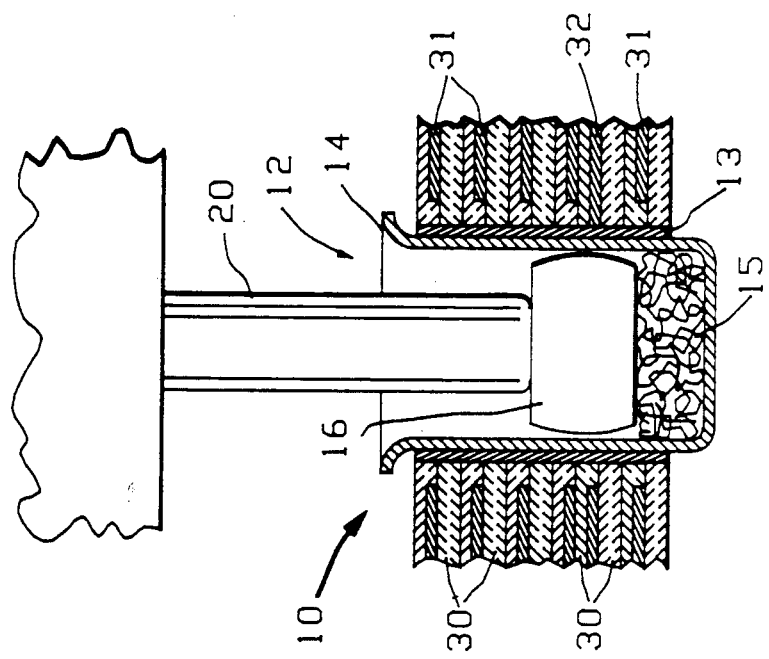
FIGS. 2A and 2B are detailed sectional views which are taken through one of the holes of the FIG. 1 socket.
Figure 2B:
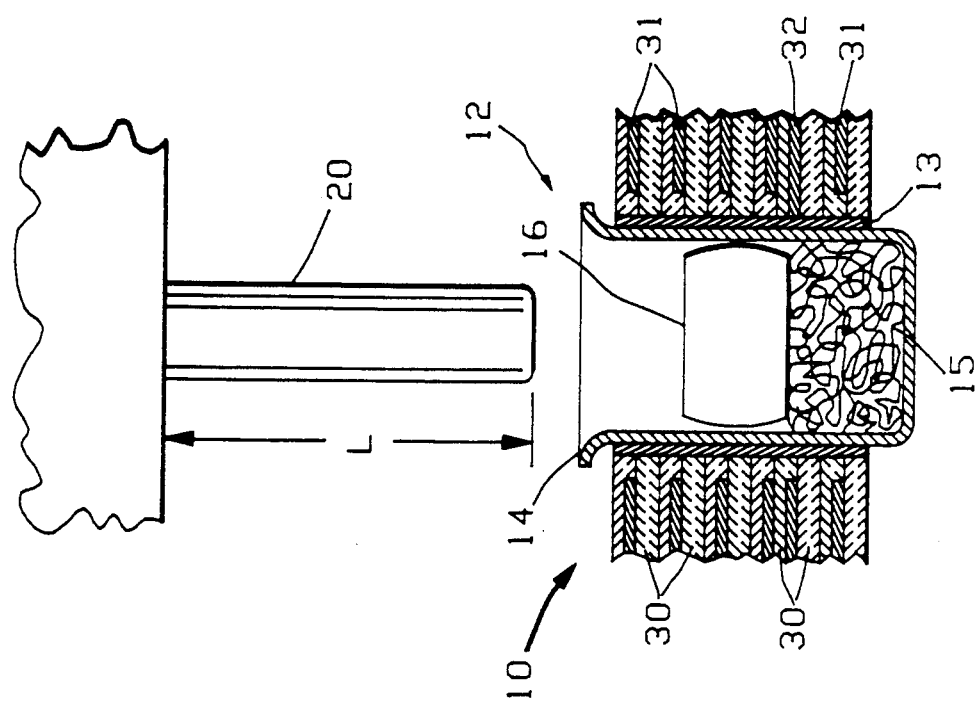

Referring now to FIGS. 1, 2A and 2B, a preferred embodiment of an electromechanical socket 10 that is constructed according to the invention will be described in detail. Beginning first with FIG. 1, it shows a greatly enlarged pictorial view of the socket 10. In this embodiment, the socket 10 is integrated into and includes a portion of an electrically insulative base 11. Formed in this base portion of the socket are a plurality of elongated holes 12 which extend from a substantially planar surface 11a into the interior of the base. These holes 12 are arranged in a pattern that enables the input/output pins of an electrical component (not shown) to be inserted into the holes.

A detailed sectional view which is taken through one of the socket holes 12 is shown in FIGS. 2A and 2B. There, the sidewall of the hole 12 is plated with a conductor 13, and a conductive sleeve 14 is press fit and/or soldered to the conductive coating. Inserted into the sleeve 14 and located on the bottom thereof is a sponge-like mass 15 of springy electrically conductive fibers. This mass can be made, for example, by wadding a wire of 2 mils diameter such that it fits in the sleeve 14 and has a spring constant in all directions of about 0.01 oz/mil to 10 oz/mil. Resting on top of the sponge-like mass 15 is an electrically conductive piston 16 which lies entirely within the sleeve 14.

In FIGS. 2A and 2B, one of the input/output pins of the electronic component that is to be inserted into the sleeve 14 is indicated by reference numeral 20. FIG. 2A shows the pin 20 prior to its insertion into the sleeve; whereas FIG. 2B shows the pin 20 after its insertion into the sleeve. As the FIG. 2B insertion occurs, the pin 20 pushes the piston 16 in a downward direction toward the bottom of the sleeve. That squashes the springy sponge-like mass 15 in the downward direction and tends to expand it in the horizontal direction. Due to this expansion, a low resistance electrical contact is made between the sponge-like mass 15 and the sidewalls of the sleeve 14. Preferably, the piston 16 is barrel-shaped as illustrated because it was found that such a shape prevents the piston from sticking as it moves up and down in the sleeve.

Also as FIGS. 2A and 2B show, the base 11 is comprised of multiple laminated insulative layers 30 on which two sets of electrical conductors 31 and 32 are patterned. These layers 30 preferably are made of epoxy glass or ceramic. Each of the conductors 31 surround all of the holes 12 and carry a ground voltage. One such conductor 31 lies on every other insulative layer. By comparison, the conductors 32 selectively lie on the remaining insulative layers 30, and they carry input/output signals respectively to the sleeves 14. For example, the signal to the one sleeve of FIGS. 2A and 2B is made by the conductor 32 which is on the second insulative layer from the bottom.

A primary feature of the socket 10 is that the holes 12 can be spaced with a high density. This feature occurs because all of the moving parts 15 and 16 of the socket are in line with the axis of pin 20, rather than around the pin. If the pins have a diameter of X mils, the holes 12 can have a diameter of X +15 mils and their center-to-center spacing can be X +25 mils. Thus, for an integrated circuit package having 15 mil diameter input/output pins, a socket can be made with a center-to-center hole spacing of 15+25 or 40 mils. By comparison, present day state-of-the-art sockets have center-to-center hole spacings of no less than 60 mils.

Another feature of the above-described socket is that the electrical path from the pin 20 to conductor 32 is low in inductance and capacitance. This occurs because the components 14 and 15 are short and wide, and because the ground carrying conductors 31 minimize any parasitic reactive coupling between the components 14 and 15 in adjacent holes. By comparison, prior art zero insertion force sockets have a long narrow leg which carries current from each pin. Such a shape gives rise to an inductance; and, in the absence of ground planes, the respective inductances of several pins in close proximity will couple together.

Still another feature of the above described socket is that its moving parts 14 and 15 do not tend to wear out. This occurs because each of the moving parts 14 and 15 bears a force that is exerted by only a single pin 20, and any reactive frictional force is proportional to it. By comparison, prior art zero insertion force sockets have a moveable member that is moved with a lever to open and close all of the socket contacts. With such a design, the moveable member must overcome the total force of all the contacts, and thus the friction that occurs between the moveable member and the lever will be proportional to that total force of all the contacts.

Yet another feature of the above described socket 10 is that the springy sponge-like mass 15 compensates for various manufacturing tolerances that always exist to some extent in the length L of the pins 20. These tolerances vary in degree depending upon the precision with which the package is made. Present day components generally have a pin length tolerance of about ±3 mils. With the present invention, such length tolerances are compensated for by making the distance by which the mass 15 is squashed at least twice as large as the pin length tolerance. For example, if the pin length tolerance is ±3 mils, a suitable height of the mass 15 in the uncompressed state is 60 mils, and a suitable height when it is compressed with a ½oz to 2 oz force is 50–20 mils.

A preferred embodiment of the invention has now been described in detail. In addition, however, many changes and modifications ca be made to those details without departing from the nature and spirit of the invention. Examples of such modifications are shown in FIGS. 3, 4, and 5.

Figure 3:
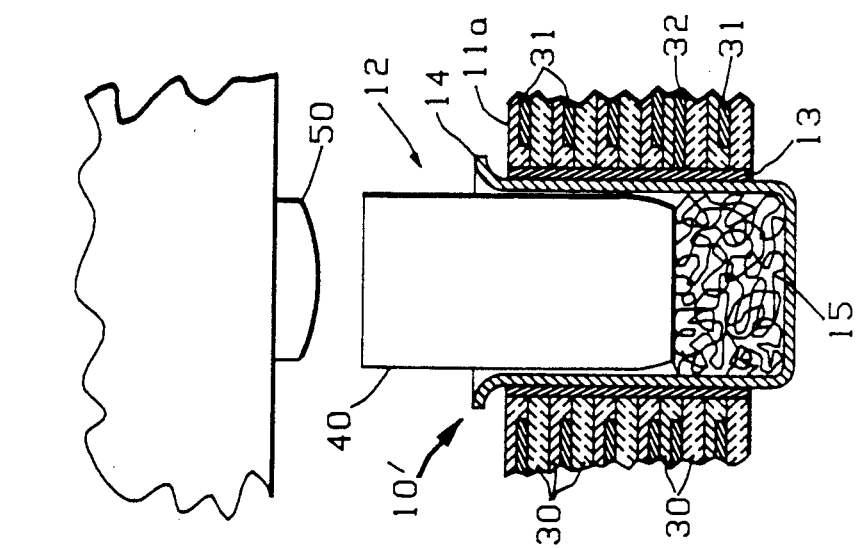
FIG. 3 is a detailed sectional view which illustrates a second embodiment of the invention.

In FIG. 3, the socket is indicated by reference numeral 10'. This socket 10, includes a piston 40 which extends outside of the sleeve 14. Such a modification enables the socket to make electrical connections with electronic components that have input/output bumps 50 rather than the previously described input/output pins 20. All of the other components that make up the embodiment 10' are the same as those which are in the embodiment 10, and they are identified with like reference numerals.

Figure 4:
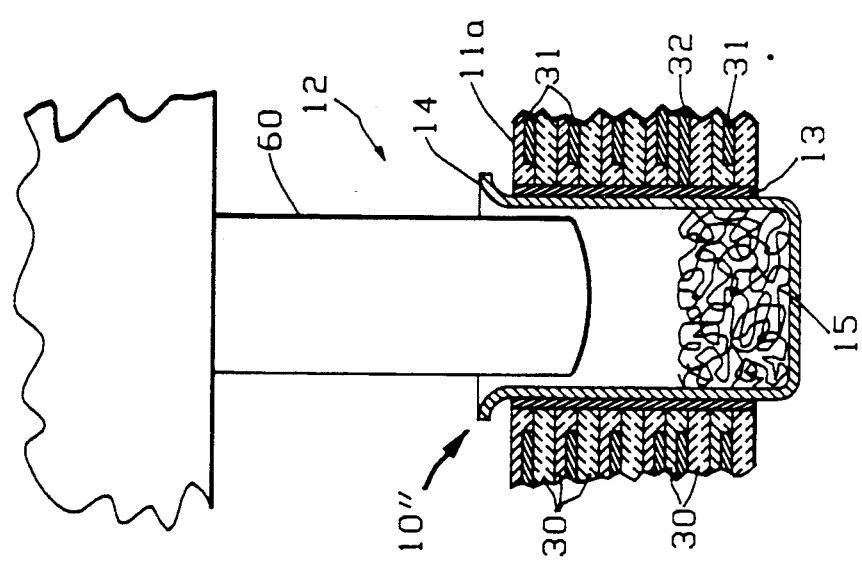
FIG. 4 is a detailed sectional view which illustrates a third embodiment of the invention.

In FIG. 4, the modified socket is indicated by reference numeral 10''. This embodiment 10'' is the same as embodiment 10 of FIGS. 2A and 2B with the exception that the piston 16 is eliminated. Such elimination can be made provided that the electronic component which is used with the socket has input/output pins 60 which are wide enough to not stick in the springy sponge-like mass 15. In FIG. 4, the pin 60 is nearly as wide as the hole 12; whereas in FIGS. 2A and 2B, the pin 20 is only about half as wide as the hole 12.

Figure 5:
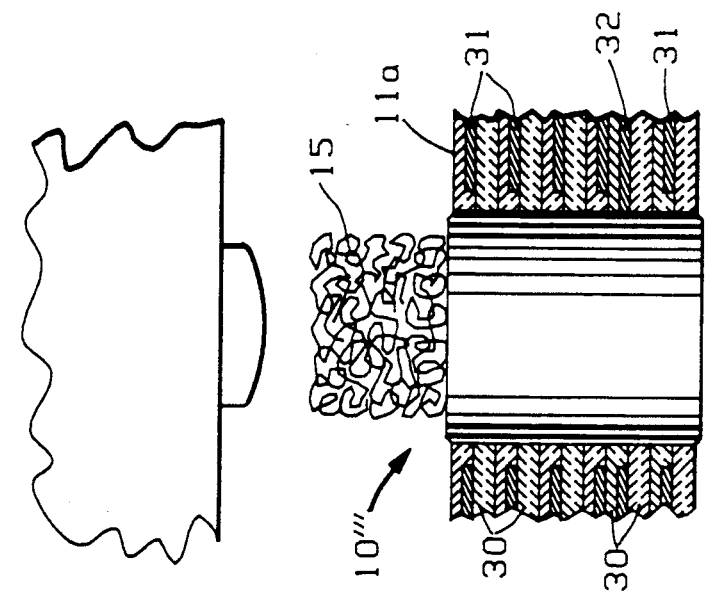
FIG. 5 is a detailed sectional view which illustrates a fourth embodiment of the invention.

In FIG. 5, the socket is indicated by reference numeral 10'''. There, the sleeve 14 and pin 16 are eliminated; the hole 12 is filled with an electrical conductor such as solder; and the electrically conductive sponge-like mass 15 is held on surface 11a by the solder. This embodiment 10''' has the advantage of using fewer components than any of the other previously described embodiments.

As yet another modification, several of the sockets 10, 10', 10'', and 10''' can be integrated into a single substrate 11. Also in that substrate, the conductors 32 which carry signals to/from the input/output pins or bumps of a component can be routed in any desired manner, such as from socket to socket, or to a connector that is mounted on the substrate.

Accordingly, since many such changes and modifications can be made, it is to be understood that the invention is not limited to the details of any one particular illustrated preferred embodiment but is defined by the appended claims.

What is claimed is:

1. A socket for an electronic component, which is comprised of:
   an electrically insulative base having a substantially planar surface;
   said base having a plurality of elongated holes that extend from said surface into said base;
   electrical signal paths integrated into said base which are exposed on sidewalls said holes;
   each of said holes containing a respective electrically conductive spring and an electrically conductive piston which rests on said spring; and,
   each spring being a sponge-like mass which is forced against a respective one of said electrical signal paths in response to being compressed in the direction of elongation by terminals on said component.

2. A socket, for making respective connections to a plurality of input/output terminals on an electronic component, which is comprised of:
   an electrically insulative base having electrical signal paths integrated therein;
   a plurality of electrically conductive springs, each of which is a sponge-like mass, held by said base in a plane;
   each sponge-like mass being adapted to be compressed and not penetrated perpendicular to said plane by a respective one of said input/output terminals, and to bulge parallel to said plane in response thereto;
   said electrical signal paths being disposed in said base such that said bulge in each sponge-like mass presses against a respective signal path to make said connections.

3. A socket according to claim 2 wherein said base has a plurality of elongated holes that extend into the base, and wherein said springs are respectively mounted in said holes.

4. A socket according to claim 3 wherein each spring is a wad of springy wire.

5. A socket according to claim 3 wherein each spring has a spring constant of from 0.01 oz/mil to 10 oz/mil.

6. A socket according to claim 3 wherein each of said holes further contains a respective electrically conductive piston which rests on top of the spring that lies in the same hole.

7. A socket according to claim 6 wherein each of said pistons is contained entirely within the hole in which it lies.

8. A socket according to claim 6 wherein each of said pistons extends outside of the hole in which it lies.

9. A socket according to claim 6 wherein each of said pistons is barrel-shaped.

10. A socket, for making respective connections to a plurality of input/output terminals on an electronic component, which is comprised of:
- an electrically insulative base having electrical signal paths integrated therein;
- a plurality of electrically conductive springs that are compressible in all directions held by said base and being in contact with said signal paths;
- said springs having moveable ends that terminate in substantially one plane; and
- said moveable ends of said springs being adapted to be compressed and not penetrated perpendicular to said one plane by said input/output terminals in said component.

11. A socket according to claim 10 wherein said base has a flat surface on which said springs are mounted.

* * * * *